United States Patent
Shiraishi et al.

(10) Patent No.: US 9,523,716 B2
(45) Date of Patent: Dec. 20, 2016

(54) PROBE GUIDE PLATE AND METHOD FOR MANUFACTURING THE SAME

(71) Applicants: SHINKO ELECTRIC INDUSTRIES CO., LTD., Nagano-shi, Nagano (JP); JAPAN ELECTRONIC MATERIALS CORPORATION, Amagasaki-shi, Hyogo (JP)

(72) Inventors: Akinori Shiraishi, Nagano (JP); Kosuke Fujihara, Nagano (JP)

(73) Assignees: SHINKO ELECTRIC INDUSTRIES CO., LTD., Nagano-Shi (JP); JAPAN ELECTRONIC MATERIALS CORPORATION, Amagasaki-Shi (JP)

( * ) Notice: Subject to any disclaimer, the term of this patent is extended or adjusted under 35 U.S.C. 154(b) by 150 days.

(21) Appl. No.: 14/202,701

(22) Filed: Mar. 10, 2014

(65) Prior Publication Data

US 2014/0266274 A1    Sep. 18, 2014

(30) Foreign Application Priority Data

Mar. 13, 2013  (JP) .................................. 2013-050078

(51) Int. Cl.
*G01R 1/073*    (2006.01)

(52) U.S. Cl.
CPC ....... *G01R 1/07357* (2013.01); *G01R 1/07371* (2013.01)

(58) Field of Classification Search
None
See application file for complete search history.

(56) References Cited

U.S. PATENT DOCUMENTS

| | | | |
|---|---|---|---|
| 6,171,902 B1* | 1/2001 | Ida | H01L 27/10852 257/E21.019 |
| 6,337,572 B1 | 1/2002 | Kazama | |
| 6,424,048 B1* | 7/2002 | Umetsu | B23K 26/06 257/507 |
| 6,563,079 B1* | 5/2003 | Umetsu | B23K 26/0656 219/121.69 |
| 6,847,221 B2 | 1/2005 | Kimoto et al. | |
| 6,922,069 B2 | 7/2005 | Jun | |
| 7,279,776 B2* | 10/2007 | Morimoto | H01L 21/76898 257/621 |
| 8,922,234 B2* | 12/2014 | Shiraishi | G01R 1/07314 174/251 |
| 2002/0166232 A1* | 11/2002 | Fujita | B05C 5/027 29/890.1 |

(Continued)

FOREIGN PATENT DOCUMENTS

| JP | 2002-296297 | 10/2002 |
|---|---|---|
| JP | 2004-317492 | 11/2004 |

(Continued)

*Primary Examiner* — Paresh Patel
(74) *Attorney, Agent, or Firm* — Rankin, Hill & Clark LLP

(57) ABSTRACT

There is provided a probe guide plate. The probe guide plate includes: a substrate having a through hole for guiding a probe, which is formed through the substrate, wherein the substrate includes a first main surface and a second main surface opposite to the first main surface; and a first insulating film formed on an inner wall of the through hole and on the first and second main surfaces of the substrate such that portions of the first and second main surfaces of the substrate are exposed.

11 Claims, 16 Drawing Sheets

(56) References Cited

U.S. PATENT DOCUMENTS

2010/0212950 A1* 8/2010 Sakaguchi ......... G01R 1/07307
　　　　　　　　　　　　　　　　　　　　174/262
2014/0266275 A1　9/2014 Kimura et al.

FOREIGN PATENT DOCUMENTS

| JP | 2007-171139 | 7/2007 |
| WO | 2014/021194 | 2/2014 |

* cited by examiner

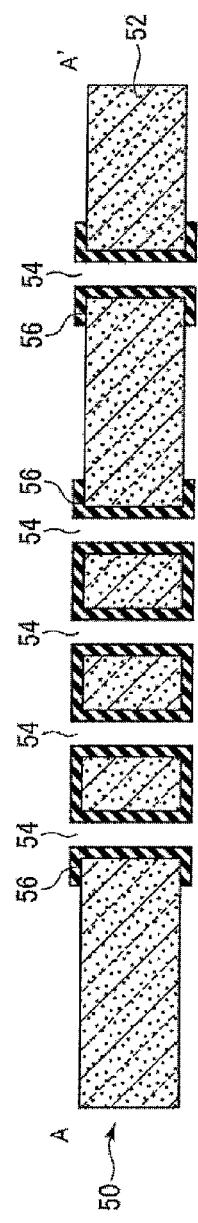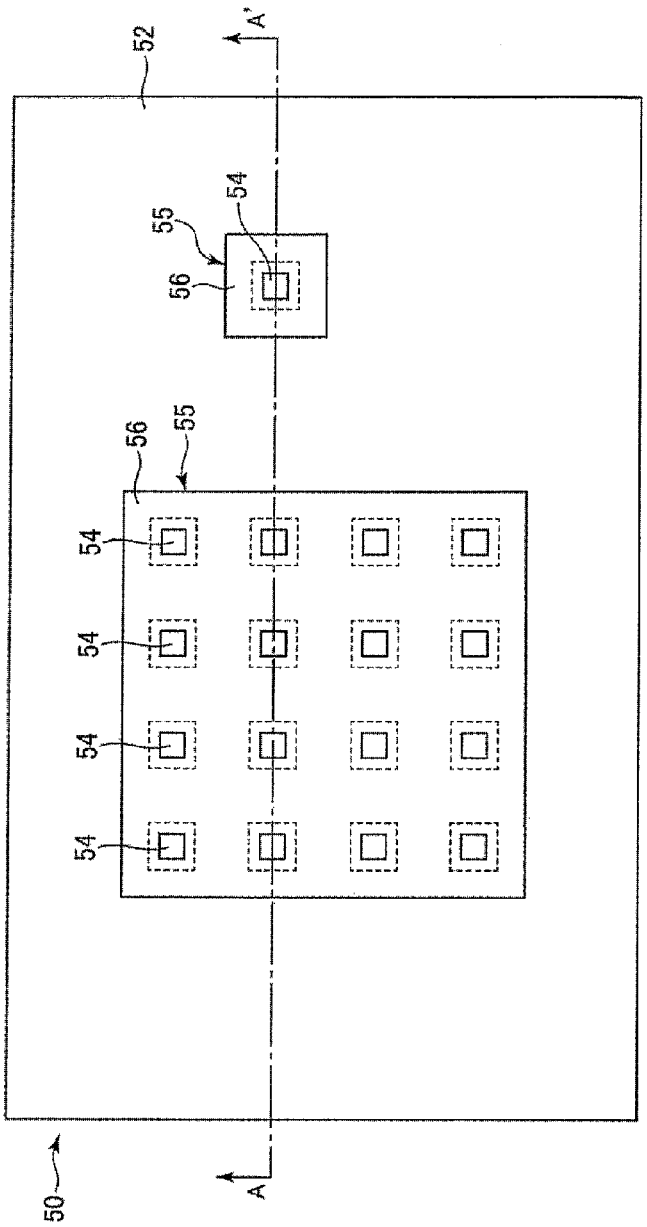
FIG. 3A
FIG. 3B

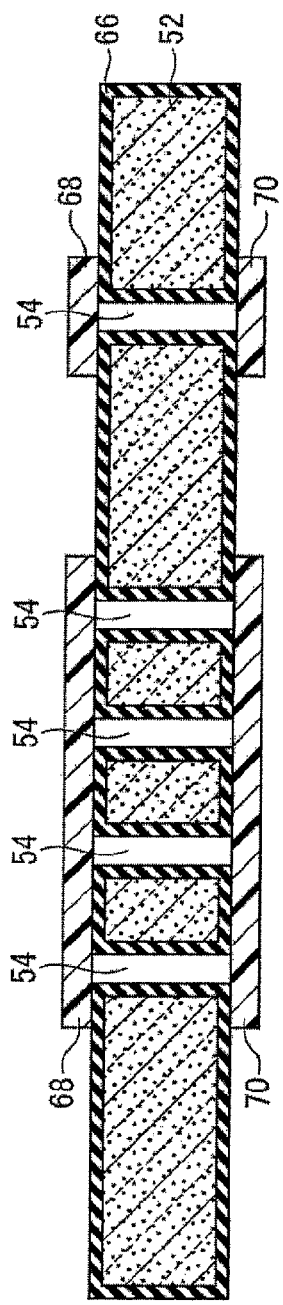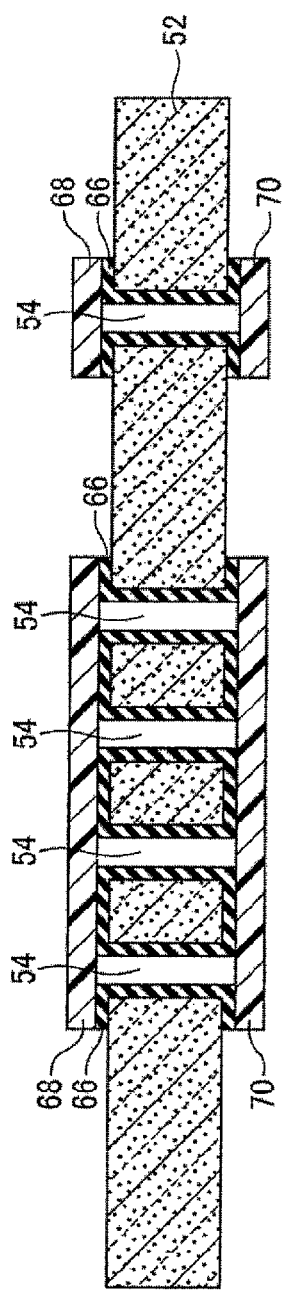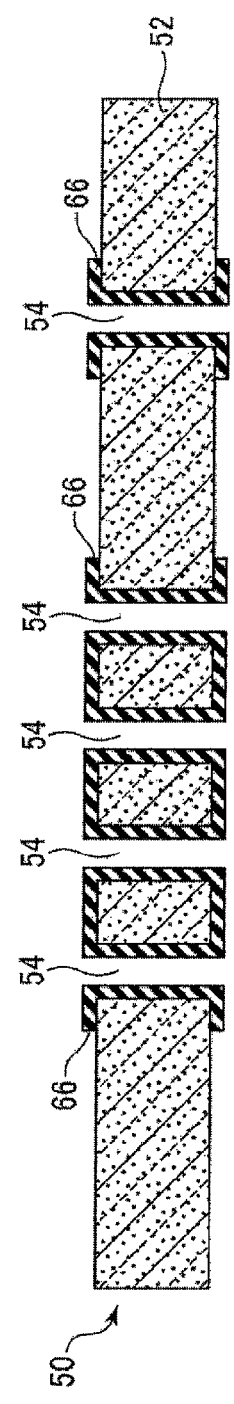

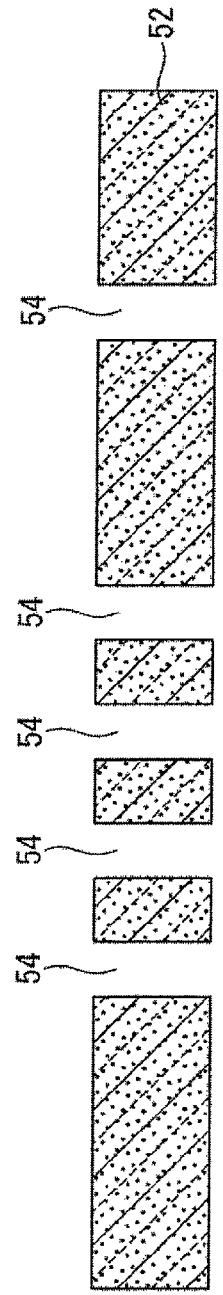
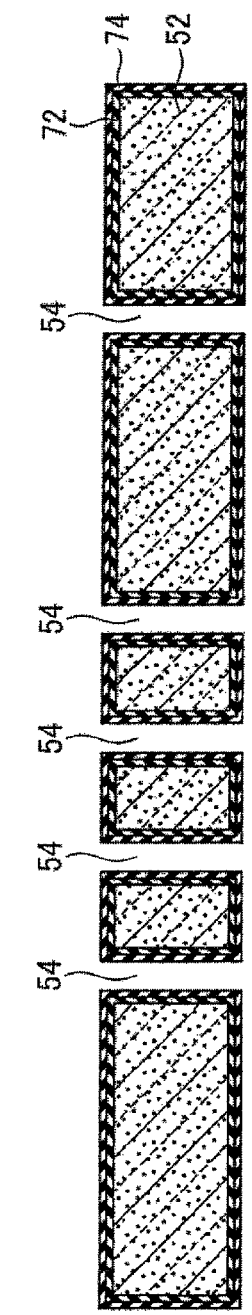
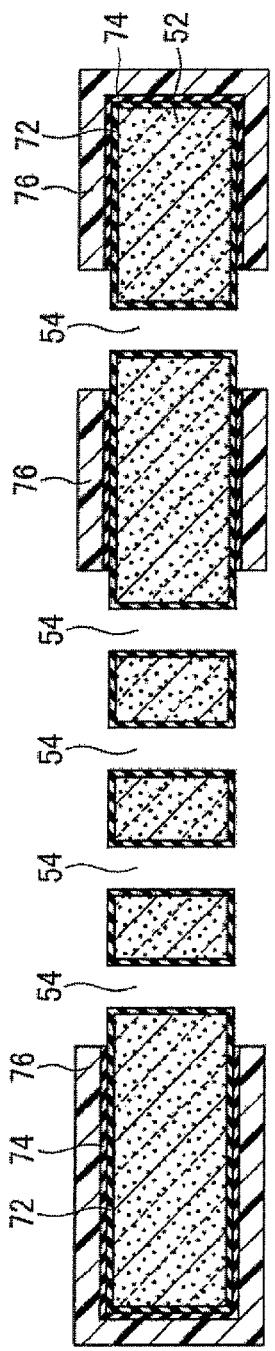
FIG. 7A
FIG. 7B
FIG. 7C

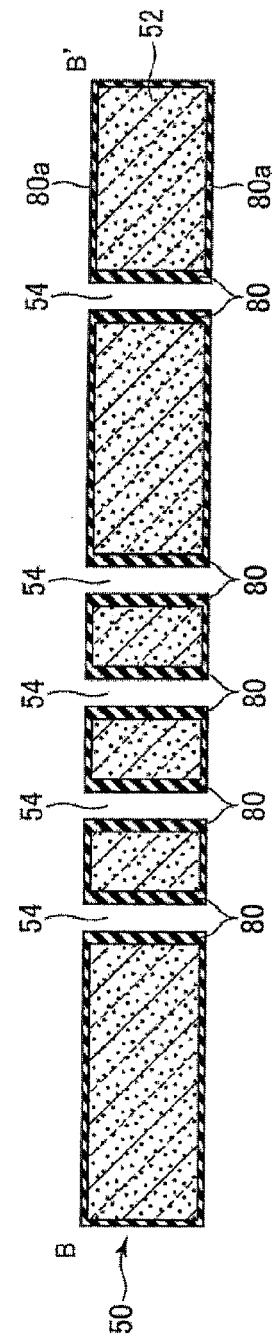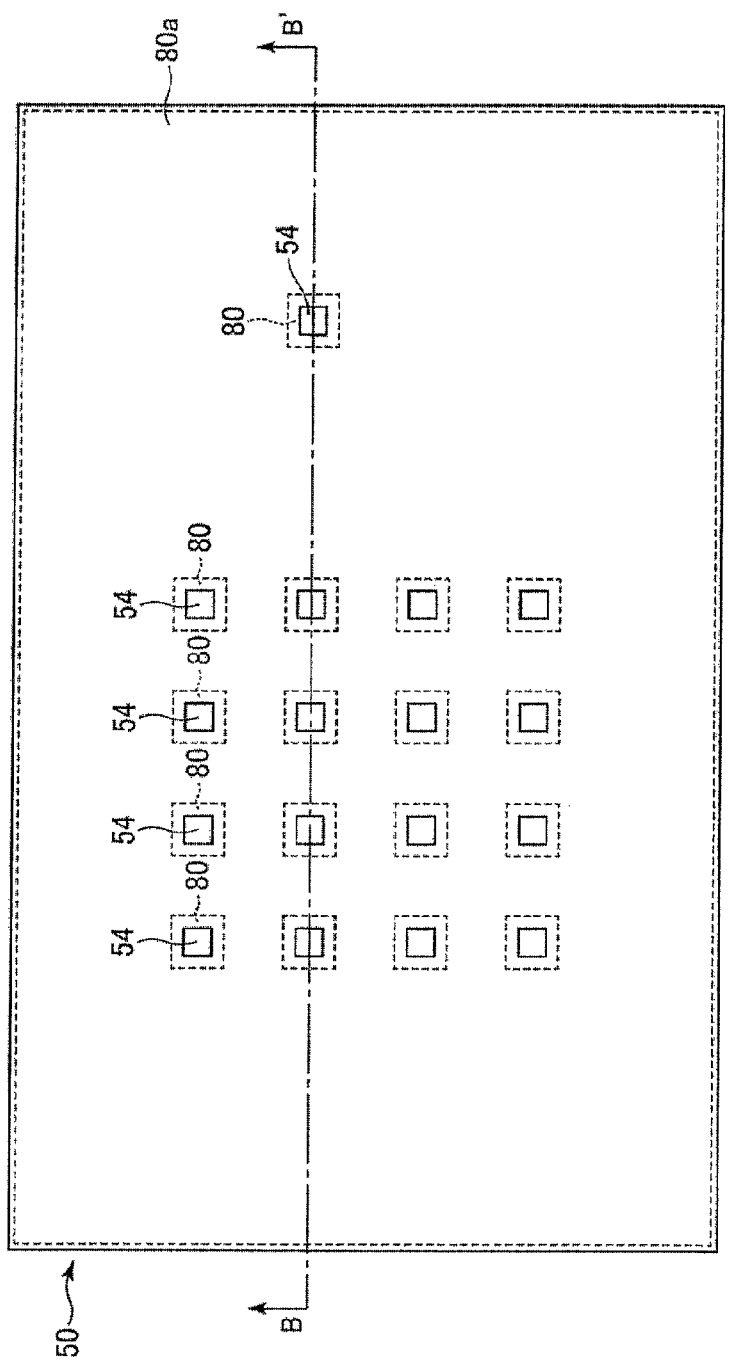
FIG. 9A
FIG. 9B

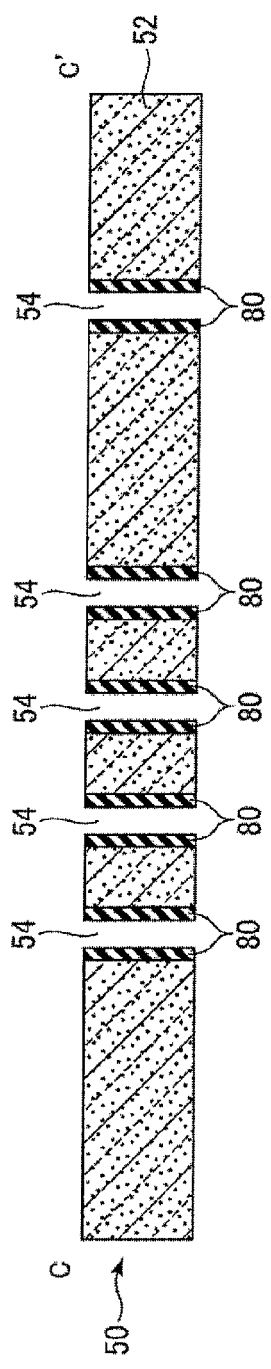
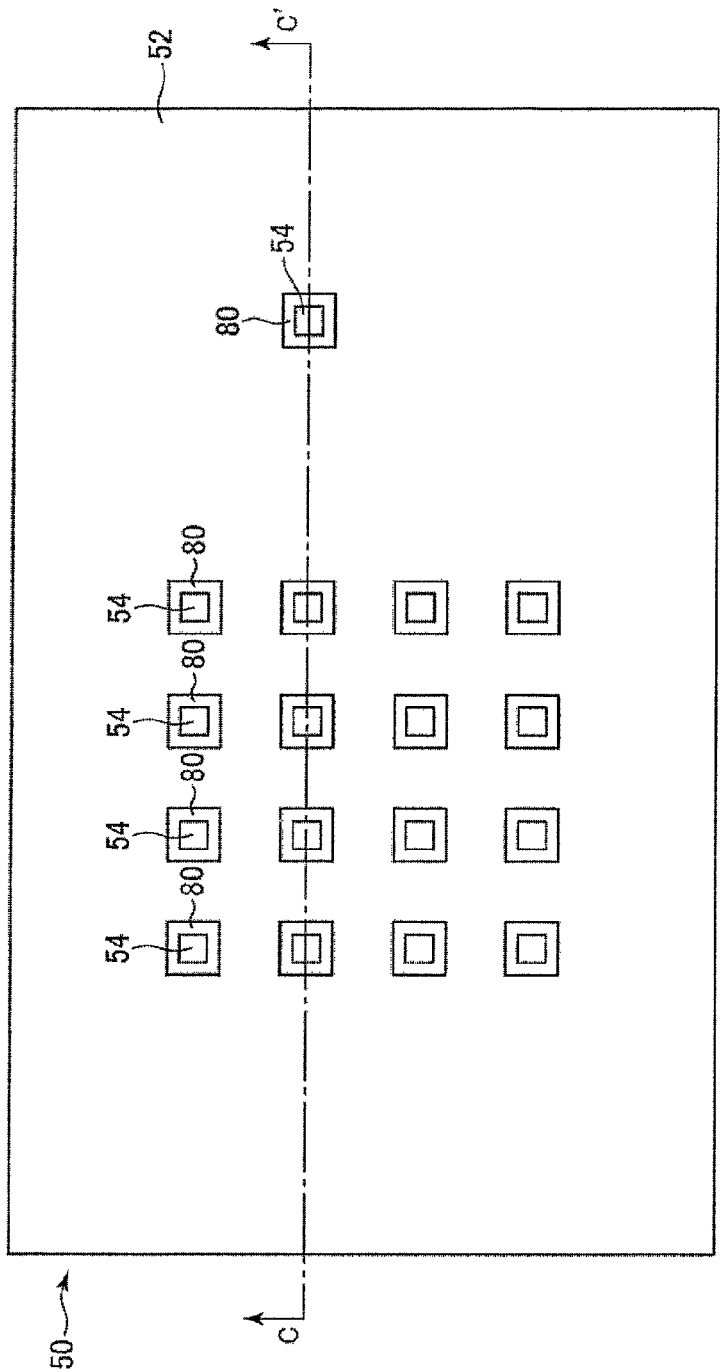
FIG. 13A
FIG. 13B

PROBE GUIDE PLATE AND METHOD FOR MANUFACTURING THE SAME

This application claims priority from Japanese Patent Application No. 2013-050078, filed on Mar. 13, 2013, the entire contents of which are herein incorporated by reference.

BACKGROUND OF THE INVENTION

1. Technical Field

The present disclosure relates to a probe guide plate and a method for manufacturing the same.

2. Description of the Related Art

There has been known a structure in which a probe support board is used for supporting probes mounted in a probe card. A plurality of probes are mounted in the probe support board of the probe card so that the probe card and a wafer are connected to each other through the probes. The probe support board is provided with a semiconductor layer such as a silicon substrate and an insulating cover film with which the semiconductor layer is covered. The insulating cover film is formed by thermally oxidizing the semiconductor layer in which through holes for guiding probes are formed, so that inner walls of the through holes are also covered with the insulating cover film. In this manner, probes are mounted in the probe support board while insulation between the probes and the semiconductor layer of the probe support board is ensured (see JP-A-2007-171139, for example).

However, the through holes for guiding probes to be mounted may be misaligned in the related art.

SUMMARY OF THE INVENTION

One of illustrative aspects of the present invention is to provide a probe guide plate in which misalignment of through holes for guiding probes can be suppressed, and a method for manufacturing the probe guide plate.

According to one or more aspects of the present invention, there is provided a probe guide plate. The probe guide plate includes: a substrate having a through hole for guiding a probe, which is formed through the substrate, wherein the substrate includes a first main surface and a second main surface opposite to the first main surface; and a first insulating film formed on an inner wall of the through hole and on the first and second main surfaces of the substrate such that portions of the first and second main surfaces of the substrate are exposed.

According to one or more aspects of the present invention, there is provided a probe guide plate. The probe guide plate includes: a substrate having a through hole for guiding a probe, which is formed through the substrate; and a first insulating film formed on only an inner wall of the through hole.

BRIEF DESCRIPTION OF THE DRAWINGS

FIGS. 3A and 3B are views showing a probe guide plate according to a first embodiment;

FIGS. 6A to 6C are sectional views of steps showing the first method for manufacturing the probe guide plate according to the first embodiment;

FIGS. 7A to 7C are sectional views of steps showing a second method for manufacturing the probe guide plate according to the first embodiment;

FIGS. 9A and 9B are views showing a probe guide plate according to a second embodiment;

FIGS. 13A and 13B are views showing a probe guide plate according to a third embodiment;

DETAILED DESCRIPTION

Embodiments of the invention will be now described referring to the attached drawings.

As described above, the whole surface of the probe support board is covered with the insulating cover film formed by thermal oxidation in the related art. For this reason, stress may occur in a silicon substrate due to a difference in coefficient of thermal expansion between a silicon thermal oxide film as the insulating cover film and the silicon substrate as the semiconductor layer so that through holes for guiding probes to be mounted may be misaligned.

[Semiconductor Testing Apparatus]

Figure 1:
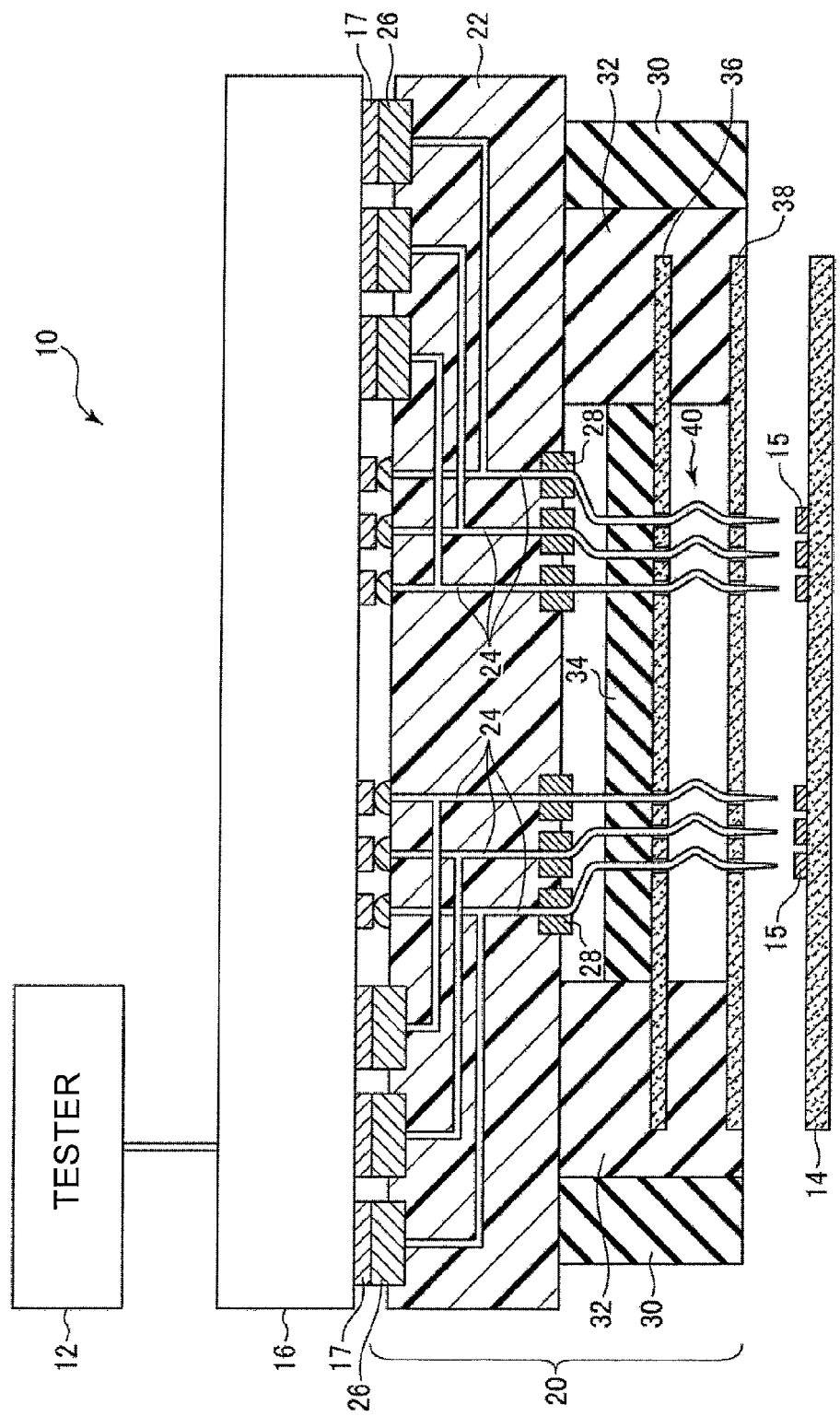
FIG. 1 is a view schematically showing a semiconductor testing apparatus.
Figure 2:
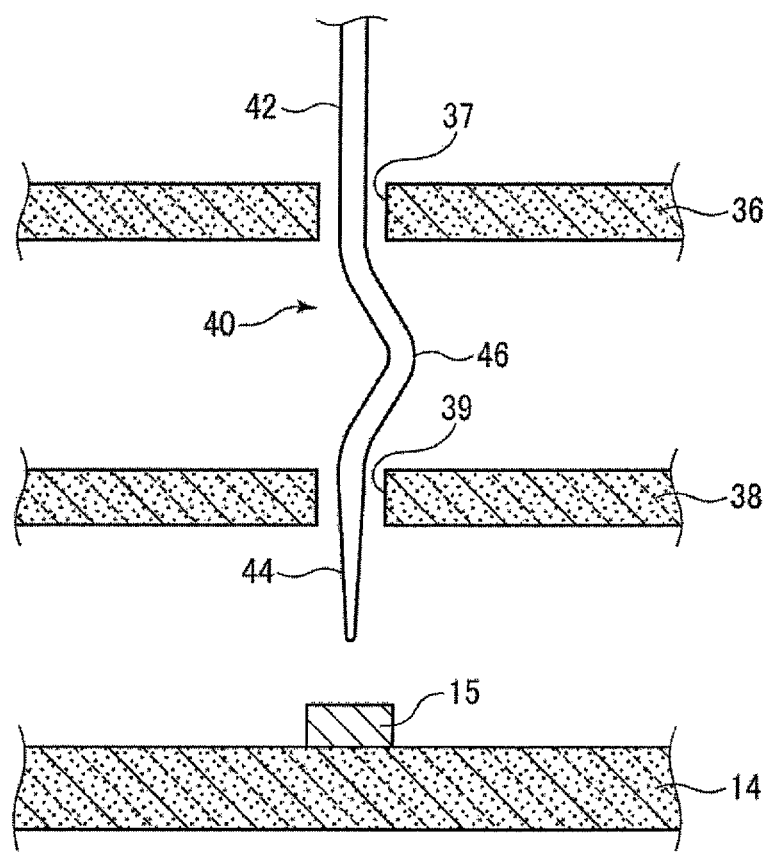
FIG. 2 is a diagram showing a probe of the semiconductor testing apparatus.

First, a semiconductor testing apparatus will be described with reference to FIG. 1. FIG. 1 is a view schematically showing the semiconductor testing apparatus. FIG. 2 is a view showing a probe.

The semiconductor testing apparatus 10 has a tester 12, a probe device 20, and an interposer board 16. The tester 12 is configured to apply a current to a semiconductor device and test whether the semiconductor device operates normally or not. The probe device 20 is configured to put needles (probes) on electrodes 15 of a device under test (DUT) 14 such as a semiconductor wafer. The interposer board 16 is provided between the tester 12 and the probe device 20. In the interposer board 16, a wiring layer (not shown) is formed.

A wiring board 22 in which wirings 24 have been formed internally is provided in an upper portion of the probe device 20. For example, the wiring board 22 is formed by a printed wiring board (PCB).

Electrodes 26 are provided in an upper surface of the wiring board 22 and electrodes 28 are provided in a lower surface of the wiring board 22. The electrodes 26 in the upper surface and the electrodes 28 in the lower surface are electrically connected to each other through the wirings 24. The electrodes 26 in the upper surface of the wiring board 22 are electrically connected to electrodes 17 in a lower surface of the interposer board 16 respectively.

A housing 30 for fixing the needles (probes) 40 is provided under the wiring board 22. A ceramic substrate 34 for fixing the probes 40, and two probe guide plates 36 and 38 for guiding the probes 40 are retained by a holder 32 inside the housing 30.

As shown in FIG. 2, a bent portion 46 is formed between a base portion 42 and a distal end portion 44 in each probe 40. The distal end portion 44 of the probe 40 is pressed against an electrode 15 of the DUT 14 with suitable pressure due to elasticity of the bent portion 46.

While the base portion 42 of the probe 40 is guided by a through hole 37 of the upper probe guide plate 36, the distal end portion 44 of the probe 40 is guided by a through hole 39 of the lower probe guide plate 38.

It is preferable that the through holes 37 and 39 in the probe guide plates 36 and 38 accurately align with the electrode 15 of the DUT 14. When the through holes 37 and 39 of the probe guide plates 36 and 38 are displaced too largely to connect the probe 40 and the electrode 15 to each other, inspection cannot be performed normally.

To press the distal end portion 44 of the probe 40 against the electrode 15 of the DUT 14, the probe 40 as a whole is moved vertically. In this manner, the base portion 42 of the probe 40 slides on the through hole 37 of the upper probe guide plate 36 while the distal end portion 44 of the probe 40 slides on the through hole 39 of the lower probe guide plate 38.

First Embodiment

Probe Guide Plate

A probe guide plate according to a first embodiment will be described with reference to FIGS. 3A and 3B. FIG. 3A is a sectional view taken along the line A-A' of the probe guide plate according to the embodiment. FIG. 3B is a plan view of the probe guide plate according to the embodiment.

For example, the probe guide plate 50 according to the embodiment can be used in the probe device 20 of the semiconductor testing apparatus 10 shown in FIGS. 1 and 2. For example, the probe guide plate 50 according to the embodiment can be used for each of the probe guide plates 36 and 38 shown in FIGS. 1 and 2.

A plurality of through holes 54 for guiding probes 40 are formed in a substrate 52 of the probe guide plate 50.

For example, the substrate 52 is a silicon substrate with a thickness of about 200 μm. Incidentally, the substrate 52 is not limited thereto. The thickness of the silicon substrate may be in a range of about 50 μm to 500 μm. In addition, the substrate 52 may be not the silicon substrate but a substrate made of another material. For example, the substrate 52 may be a conductive SiC substrate or may be a metal substrate such as a Cu substrate or an Al substrate or a ceramic substrate.

For example, each through hole 54 formed in the substrate 52 has a square shape measuring about 50 μm by about 50 μm. Incidentally, the shape of the through hole 54 is not limited to the square shape but another shape such as a circular shape or a polygonal shape may be used alternatively. In addition, the dimensions of the through hole 54 are not limited to about 50 μm. The through hole 54 may have dimensions in a range of about 10 μm to 100 μm.

The number and the positions of the plurality of through holes 54 are set in accordance with a plurality of electrodes 15 provided in an DUT 14.

An insulating film 56 is selectively formed on inner walls of the plurality of through holes 54, a front surface (first main surface) of the substrate 52 in neighbor regions 55 of the plurality of through holes 54, and a back surface (second main surface) of the substrate 52 in the neighbor regions 55 of the plurality of through holes 54.

Incidentally, silicon oxide films each having a thickness of about several nm may be formed on the front surface (first main surface) and the back surface (second main surface) of the substrate 52 by natural oxidation respectively. However, the silicon oxide films each having a thickness of about several nm and formed by nature oxidation are not included in the selectively formed insulating film 56.

The insulating film 56 serves for insulating each probe 40 and the substrate 52 from each other. The probe 40 slides repeatedly in a corresponding through hole 54 during inspection. When the probe 40 slides repeatedly, the insulating film 56 is worn. As a result, insulation between the probe 40 and the substrate 52 is spoiled to thereby make it difficult to perform inspection normally. Therefore, the insulating film 56 is required to have durability high enough to withstand the probe 40 sliding thereon.

The insulating film 56 is a silicon oxide film with an enough thickness to withstand the probe 40 sliding thereon, which silicon oxide film is, for example, about 5 μm thick. This silicon oxide film is formed, for example, by thermal oxidation. The reason why a thermal oxide film is used as the insulating film 56 is because the thermal oxide film is higher in durability against wear or the like than a silicon oxide film formed by a CVD method.

Incidentally, the film thickness of the insulating film 56 is not limited to about 5 μm but may be in a range of about 3 μm to 10 μm. When the thickness film of the insulating film 56 is relatively thin, the insulating film 56 is worn by the probe 40 sliding thereon, causing insulation failure in a relatively early stage. In order to make the insulating film 56 durable for use in a long term, it is preferable to make the film thickness of the insulating film 56 not smaller than 3 μm. On the other hand, when the film thickness of the insulating film 56 is increased, the rate of oxidation reaction is limited to thereby conspicuously lower the formation speed of the thermal oxide film. In addition, the size of the opening of each through hole 54 is excessively reduced.

For example, the neighbor region 55 of the through hole 54 means a region extending about 25 μm around the through hole 54 correspondingly to half the length of the through hole 54. Alternatively, neighbor regions 55 of through holes 54 close to one another may be formed into one large region, as shown in FIG. 3B. The insulating film 56 is not formed except on the neighbor regions 55 in the front surface and the back surface of the substrate 52.

Incidentally, the neighbor region 55 of the through hole 54 is not limited to a region extending about 25 μm around the through hole 54 but may be a region extending in a range of about 5 μm to 200 μm around the through hole 54.

Thus, according to the embodiment, the insulating film 56 of the silicon oxide film with an enough thickness to withstand the probes 40 sliding thereon is formed on the inner walls of the through holes 54 but the insulating film 56 is not formed except on the neighbor regions 55 in the front surface and the back surface of the substrate 52. Therefore, even when there is a difference between the coefficient of thermal expansion of the substrate 52 and the coefficient of thermal expansion of the insulating film 56, stress generated in the substrate 52 can be suppressed satisfactorily so that the misalignment of the plurality of through holes 54 can be suppressed satisfactorily. Accordingly, the probes 40 can be guided to accurate positions.

First Method for Manufacturing Probe Guide Plate

A first method for manufacturing the probe guide plate according to the first embodiment will be described with reference to FIGS. 4A to 4C, FIGS. 5A to 5C and FIGS. 6A to 6C. FIGS. 4A to 4C, FIGS. 5A to 5C and FIGS. 6A to 6C are sectional views of steps showing the first method for manufacturing the probe guide plate according to the first embodiment.

Figure 4A:
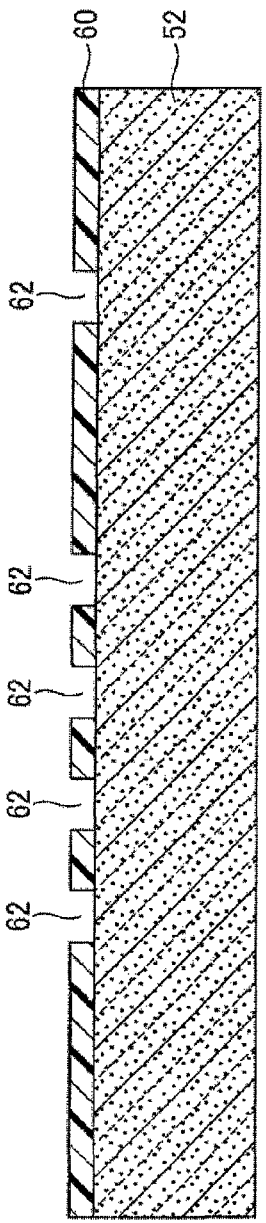
FIGS. 4A to 4C are sectional views of steps showing a first method for manufacturing the probe guide plate according to the first embodiment.

First, a silicon substrate 52 serving for manufacturing the probe guide plate according to the embodiment is prepared (FIG. 4A). The silicon substrate 52 is, for example, about 725 μm thick.

Next, a resist 60 is formed on an upper surface (front surface) of the silicon substrate 52.

Next, the resist 60 is patterned so that a plurality of openings 62 for forming a plurality of through holes 54 are formed in the resist 60 (FIG. 4A). The shape of each opening 62 formed in the resist 60 is, for example, a square shape measuring about 50 μm by about 50 μm. The number and the positions of the openings 62 are set in accordance with a plurality of electrodes 15 provided in the DUT 14.

Figure 4B:
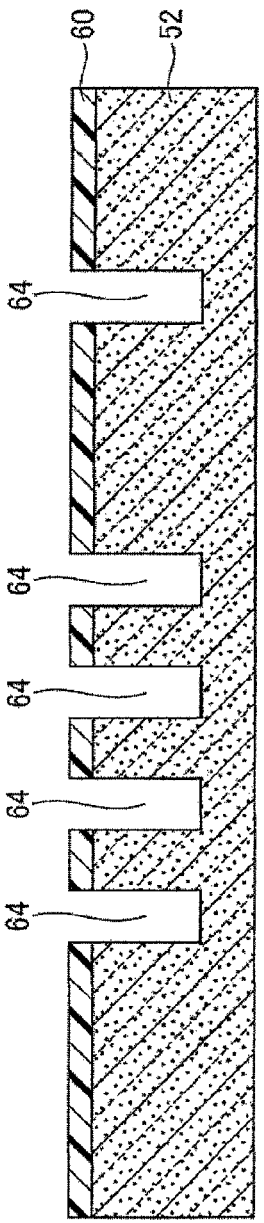

Next, the silicon substrate 52 is perforated from an upper surface (front surface) thereof using the resist 60 as a mask so as to form a plurality of non-through holes 64 which do not reach a lower surface (back surface) of the silicon substrate 52 (FIG. 4B). For example, a DEEP-RIE (Reactive Ion Etching) method can be used as the method for forming the non-through holes 64 in the silicon substrate 52.

For example, each of the plurality of non-through holes 64 has a square shape measuring about 50 μm by about 50 μm. The non-through hole 64 is about 200 μm deep. The shape, the number and the positions of the plurality of non-through holes 64 correspond to the shape, the number and the positions of the plurality of openings 62 formed in the resist 60. As a result, the plurality of non-through holes 64 are formed in alignment with the plurality of electrodes 15 provided in the DUT 14.

Figure 4C:
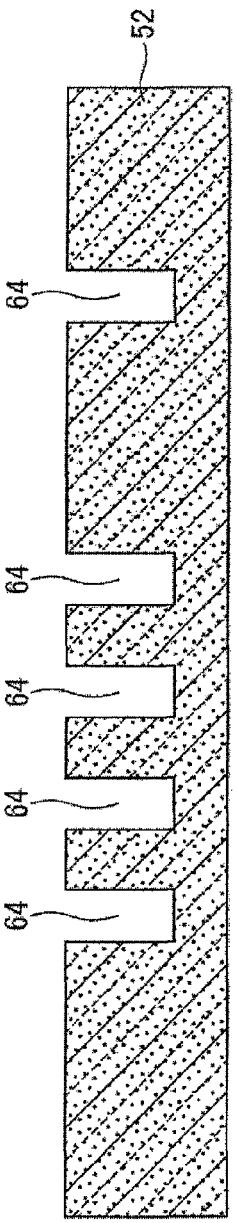

Next, the resist 60 on the upper surface (front surface) of the silicon substrate 52 is released (FIG. 4C).

Figure 5A:
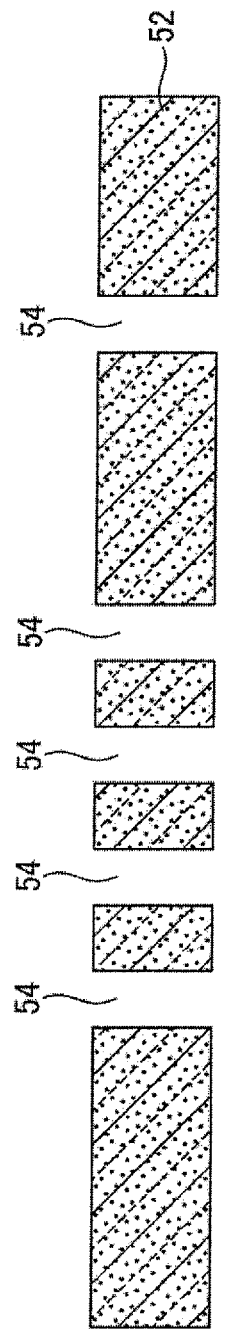
FIGS. 5A to 5C are sectional views of steps showing the first method for manufacturing the probe guide plate according to the first embodiment.

Next, the lower surface (back surface) of the silicon substrate 52 is polished. As a result, a silicon substrate 52 which is about 200 μm thick and in which a plurality of through holes 54 have been formed is formed (FIG. 5A).

Figure 5B:
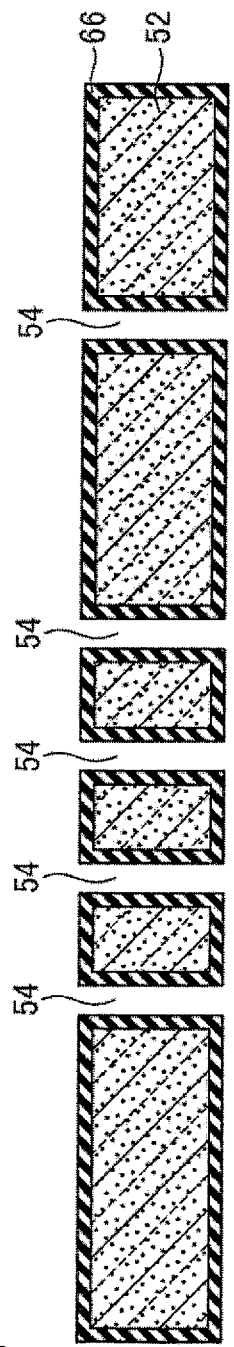

Next, the whole of the silicon substrate 52 is thermally oxidized. For example, the silicon substrate 52 is heated at about 1,000° C., for 70 hours or longer and in an $O_2$ atmosphere. As a result, for example, a silicon oxide film 66 with a thickness of about 5 μm is formed on inner walls of the plurality of through holes 54 in the silicon substrate 52 and on the front surface, the back surface and the side surface of the silicon substrate 52 (FIG. 5B).

Figure 5C:
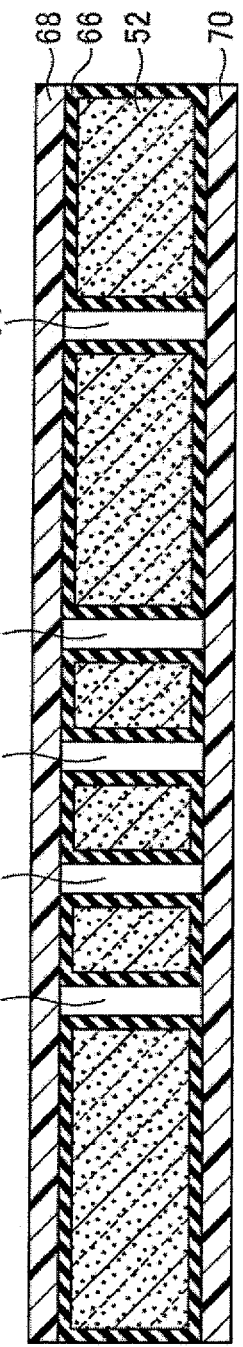

Next, resists 68 and 70 are formed on the silicon oxide film 66 on the front surface and the back surface of the silicon substrate 52 (FIG. 5C).

Next, the resists 68 and 70 are patterned so as to selectively cover neighbor regions 55 (see FIG. 3B) of the through holes 54 of the silicon substrate 52 (FIG. 6A).

Next, the silicon oxide film 66 which is not in the neighbor regions 55 of the through holes 54 of the silicon substrate 52 is etched and removed using the resists 68 and 70 as masks (FIG. 6B).

For example, the silicon oxide film 66 is etched in an etching process using a buffered hydrofluoric acid (BHF) and performed at room temperature.

In addition, the silicon oxide film 66 may be etched and removed by dry etching such as an RIE method. For example, the silicon oxide film 66 may be etched using $O_2$ or $CF_4$ as an etching gas.

Next, the resists 68 and 70 on the silicon oxide film 66 on the front surface and the back surface of the silicon substrate 52 are removed (FIG. 6C). Thus, a probe guide plate 50 according to the embodiment is completed.

Second Method for Manufacturing Probe Guide Plate

A second method for manufacturing the probe guide plate according to the first embodiment will be described with reference to FIGS. 7A to 7C and FIGS. 8A to 8C. FIGS. 7A to 7C and FIGS. 8A to 8C are sectional views of steps showing the second method for manufacturing the probe guide plate according to the first embodiment.

A silicon substrate 52 which is about 200 μm thick and in which a plurality of through holes 54 have been formed is formed in the same manner as in the first method for manufacturing the probe guide plate according to the first embodiment (FIG. 7A).

Next, a silicon nitride film 72 which is, for example, about 1 μm thick is formed on the whole surface of the silicon substrate 52, for example, by a CVD (Chemical Vapor Deposition) method (FIG. 7B). The film thickness of the silicon nitride film 72 may be in a range of about 0.5 μm to 5 μm.

To form the silicon nitride film 72 by the CVD method, for example, a raw material gas of $SiH_4$ or $NH_3$ is used and heated, for example, to about 300° C. to thereby chemically vapor-deposit the silicon nitride film 72 on the whole surface of the silicon substrate 52.

Next, on the whole surface of the silicon substrate 52 on the whole surface of which the silicon nitride film 72 has been formed, a silicon oxide film 74 which is, for example, about 1 μm thick is formed, for example, by the CVD method (FIG. 7B). The film thickness of the silicon oxide film 74 may be in a range of about 0.5 μm to 5.0 μm.

To form the silicon oxide film 74 by the CVD method, for example, a raw material gas of TEOS is used and heated, for example, to about 300° C. to thereby deposit the silicon oxide film 74 on the whole surface of the silicon substrate 52 on the whole surface of which the silicon nitride film 72 has been formed.

Next, a photoresist film 76 is applied to the whole surface of the silicon substrate 52 on which the silicon nitride film 72 and the silicon oxide film 74 have been formed. Next, the photoresist film 76 is patterned to open neighbor regions 55 (see FIG. 3B) of the through holes 54 of the silicon substrate 52 (FIG. 7C).

Next, the silicon oxide film 74 in the neighbor regions 55 of the through holes 54 of the silicon substrate 52 is etched and removed using the photoresist film 76 as a mask (FIG. 7C).

For example, the silicon oxide film 74 is etched in an etching process using a buffered hydrofluoric acid and performed at room temperature.

Alternatively, the silicon oxide film 74 may be etched and removed by dry etching such as an RIE method. For example, the silicon oxide film 74 may be etched using $O_2$ or $CF_4$ as an etching gas.

Next, the photoresist film 76 is removed.

Figure 8A:
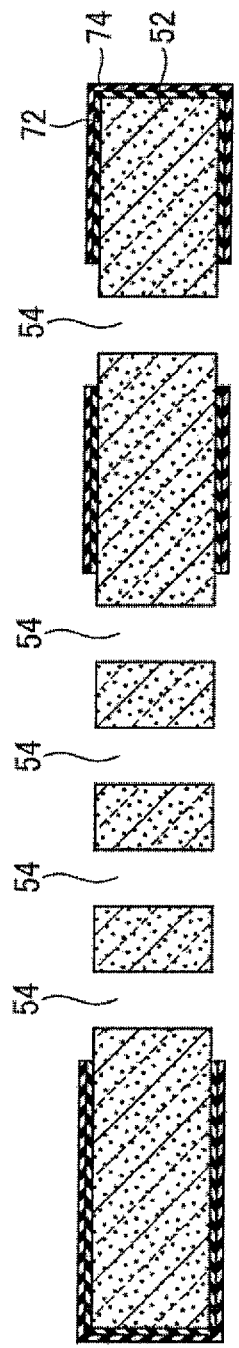
FIGS. 8A to 8C are sectional views of steps showing the second method for manufacturing the probe guide plate according to the first embodiment.

Next, the silicon oxide film 74 which remains on the other region than the neighbor regions 55 of the through holes 54 of the silicon substrate 52 is used as a mask so as to etch and remove the silicon nitride film 72 in the neighbor regions 55 of the through holes 54 of the silicon substrate 52 (FIG. 8A).

Incidentally, configuration may be made so that the photoresist film 76 is not removed but used as a mask to etch and remove the silicon nitride film 72, and the photoresist film 76 is then removed.

For example, the silicon nitride film 72 is etched in an etching process using a hot phosphoric acid and performed at about 200° C.

In this manner, a mask constituted by the silicon nitride film 72 and the silicon oxide film 74 is formed to cover the other region than the neighbor regions 55 of the through holes 54 of the silicon substrate 52 (FIG. 8A).

Next, the whole of the silicon substrate 52 is thermally oxidized. For example, the silicon substrate 52 is heated at about 1,000° C., for 70 hours or longer and in an $O_2$ atmosphere.

Figure 8B:
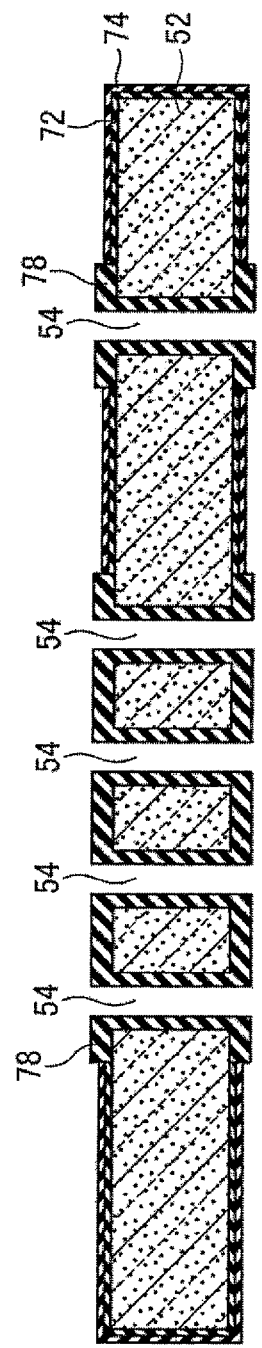

As a result, a silicon oxide film 78 which is, for example, about 5 μm thick is formed on the region which is not covered with the mask constituted by the silicon nitride film 72 and the silicon oxide film 74. That is, a silicon oxide film 78 which is, for example, about 5 μm thick is formed on the inner walls of the plurality of through holes 54 of the silicon substrate 52 and the neighbor regions 55 of the through holes 54 of the silicon substrate 52 (FIG. 8B).

Figure 8C:
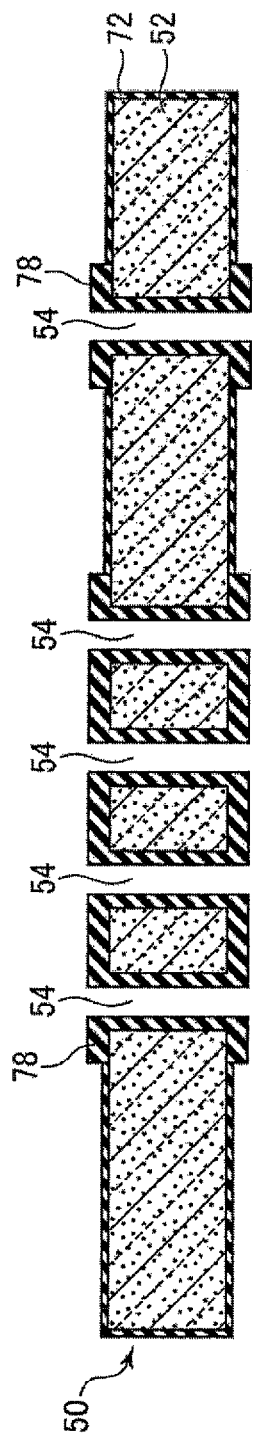

Next, the silicon oxide film 74 formed by the CVD method is removed (FIG. 8C).

For example, the silicon oxide film 74 is etched in an etching process using a buffered hydrofluoric acid and performed at room temperature.

Incidentally, the silicon oxide film 78 formed by thermal oxidation is also slightly etched by this etching process. However, since the film thickness of the silicon oxide film 78 is larger than the film thickness of the silicon oxide film 74, the silicon oxide film 78 with an enough thickness to withstand the probes 40 sliding thereon can be ensured.

A probe guide plate 50 according to the embodiment may be completed while the silicon nitride film 72 is still left as it is on the other region than the neighbor regions 55 of the through holes 54 of the silicon substrate 52 (FIG. 8C).

Alternatively, a probe guide plate 50 according to the embodiment may be completed after the silicon nitride film 72 remaining on the other region than the neighbor regions 55 of the through holes 54 of the silicon substrate 52 is etched and removed (FIG. 6C). For example, the silicon nitride film 72 is etched in an etching process using a hot phosphoric acid and performed at about 200° C.

Second Embodiment

Probe Guide Plate

A probe guide plate according to a second embodiment will be described with reference to FIGS. 9A and 9B. FIG. 9A is a sectional view taken along the line B-B' of the probe guide plate according to the embodiment. FIG. 9B is a plan view of the probe guide plate according to the embodiment. Incidentally, similar constituent members to those in the first embodiment are referred to by the same numerals correspondingly so that description thereof will be omitted or simplified.

For example, the probe guide plate 50 according to the embodiment can be used in the probe device 20 of the semiconductor testing apparatus 10 shown in FIGS. 1 and 2. For example, the probe guide plate 50 according to the embodiment can be used as each of the probe guide plates 36 and 38 in FIGS. 1 and 2. Incidentally, the probe guide plate 50 is not limited thereto but may be applied to any probe guide plate used in a probe device of any other testing apparatus.

A plurality of through holes 54 for guiding the probes 40 are formed in a substrate 52 of the probe guide plate 50.

For example, the substrate 52 is a silicon substrate with a thickness of about 200 μm. For example, each through hole 54 formed in the substrate 52 has a square shape measuring about 50 μm by about 50 μm. The number and the positions of the plurality of through holes 54 are set in accordance with a plurality of electrodes 15 provided in the DUT 14.

An insulating film 80 with an enough thickness to withstand the probes 40 sliding thereon is formed on inner walls of the plurality of through holes 54. An insulating film 80a thinner in film thickness than the insulating film 80 is formed on the front surface and the back surface of the substrate 52.

The insulating film 80 is a silicon oxide film which is thick enough to withstand the probes 40 sliding thereon, for example, about 5 μm thick. For example, the silicon oxide film is formed by thermal oxidation. Incidentally, the film thickness of the silicon oxide film is not limited to about 5 μm but may be in a range of about 3 μm to 10 μm.

The insulating film 80a is a silicon oxide film which is thinner in film thickness than the insulating film 80, for example, about 1 μm thick. For example, the insulating film 80a is formed by a CVD method. Incidentally, the film thickness of the insulating film 80a is not limited to about 1 μm but may be in a range of about 0.5 μm to 2.0 μm.

Thus, according to the embodiment, the insulating film 80 with an enough thickness to withstand the probes 40 sliding thereon is formed on the inner walls of the through holes 54 but the insulating film 80a on the front surface and the back surface of the substrate 52 is formed to be thin. Since the insulating film 80a on the front surface and the back surface of the substrate 52 is thin, stress generated in the substrate 52 is comparatively small even when there is a difference between the coefficient of thermal expansion of the substrate 52 and the coefficient of thermal expansion of each of the insulating films 80 and 80a. Therefore, the plurality of through holes 54 can be prevented from being misaligned conspicuously. Accordingly, the probes 40 can be surely connected to the electrodes 15 provided in the DUT 14.

First Method for Manufacturing Probe Guide Plate

A first method for manufacturing the probe guide plate according to the second embodiment will be described with reference to FIGS. 10A to 10C and FIGS. 11A and 11B. FIGS. 10A to 10C and FIGS. 11A and 11B are sectional views of steps showing the first method for manufacturing the probe guide plate according to the second embodiment. Incidentally, similar constituent members to those in the first embodiment are referred to by the same numerals correspondingly so that description thereof will be omitted or simplified.

Figure 10A:
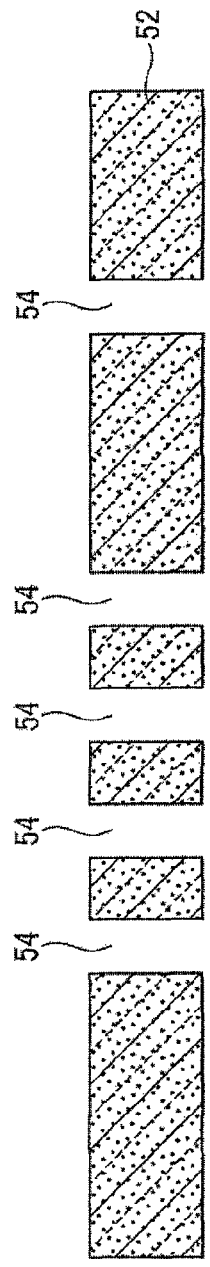
FIGS. 10A to 10C are sectional views of steps showing a first method for manufacturing the probe guide plate according to the second embodiment.

A silicon substrate 52 which is about 200 μm thick and in which a plurality of through holes 54 have been formed is formed in the same manner as in the first method for manufacturing the probe guide plate according to the first embodiment (FIG. 10A).

Figure 10B:
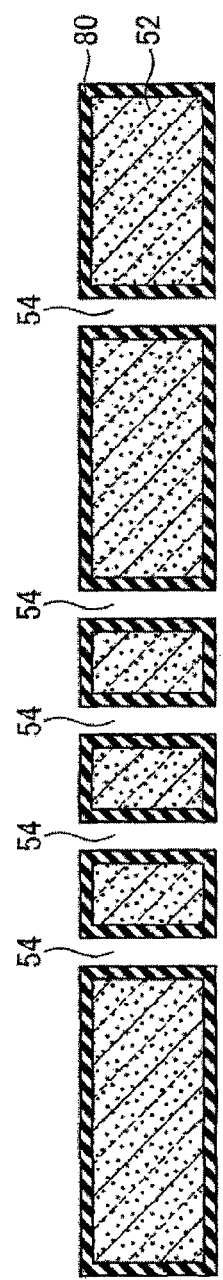

Next, the whole of the silicon substrate 52 is thermally oxidized. For example, the silicon substrate 52 is heated at about 1,000° C., for 70 hours or longer and in an $O_2$ atmosphere. As a result, for example, a silicon oxide film (insulating film) 80 with a thickness of about 5 μm is formed on inner walls of the plurality of through holes 54 in the silicon substrate 52 and on the front surface, the back surface and the side surface of the silicon substrate 52 (FIG. 10B).

Figure 10C:
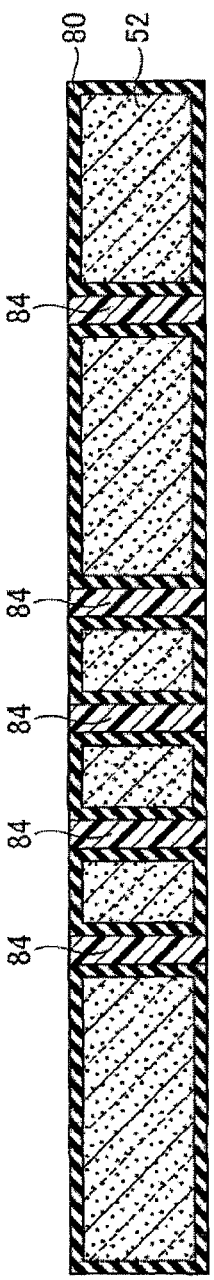

Next, an embedded member 84 having a different etching characteristic from that of the insulating film 80 is embedded in the plurality of through holes 54 on the inner walls of which the silicon oxide film 80 has been formed (FIG. 10C). For example, the embedded member 84 is made of a resin such as a photoresist. The resin is embedded by vacuum laminate or vacuum press.

Figure 11A:
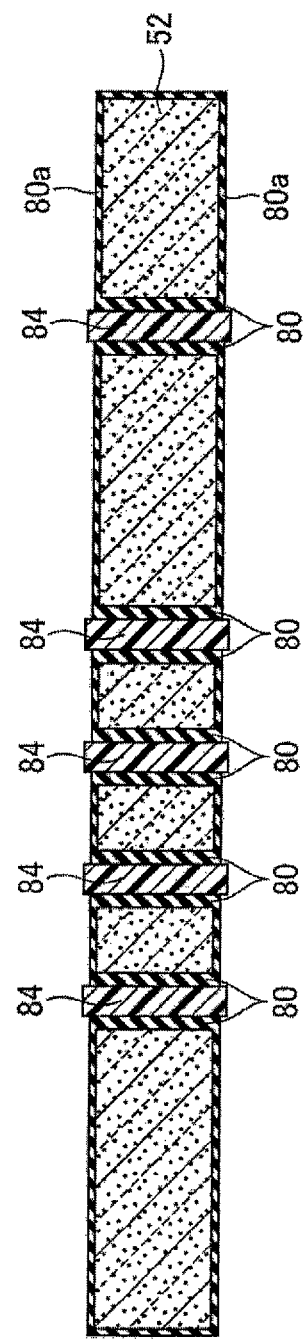
FIGS. 11A and 11B are sectional views of steps showing the first method for manufacturing the probe guide plate according to the second embodiment.

Next, the silicon oxide film 80 on the front surface, the back surface and the side surface of the silicon substrate 52 is thinned by etching to thereby form a silicon oxide film 80a with a smaller film thickness than that of the silicon oxide film 80 (FIG. 11A). Since the embedded member 84 having a different etching characteristic from that of the silicon oxide film 80 on the inner walls of the through holes 54 has been embedded on the silicon oxide film 80, the silicon oxide film 80 is not etched.

For example, the silicon oxide film 80 is etched in an etching process using a buffered hydrofluoric acid and performed at room temperature.

Alternatively, the silicon oxide film 80 may be thinned by dry etching such as RIE (Reactive Ion Etching). For example, the silicon oxide film 80 may be etched using $O_2$ or $CF_4$ as an etching gas.

Alternatively, the front surface and the back surface of the silicon substrate 52 may be polished to thin the silicon oxide film 80 on the front surface and the back surface of the substrate 52 to thereby form the silicon oxide film 80a with a smaller film thickness than that of the silicon oxide film 80. The embedded member 84 does not have to be embedded in the through holes 54 when the silicon oxide film 80a is formed by polishing.

Figure 11B:
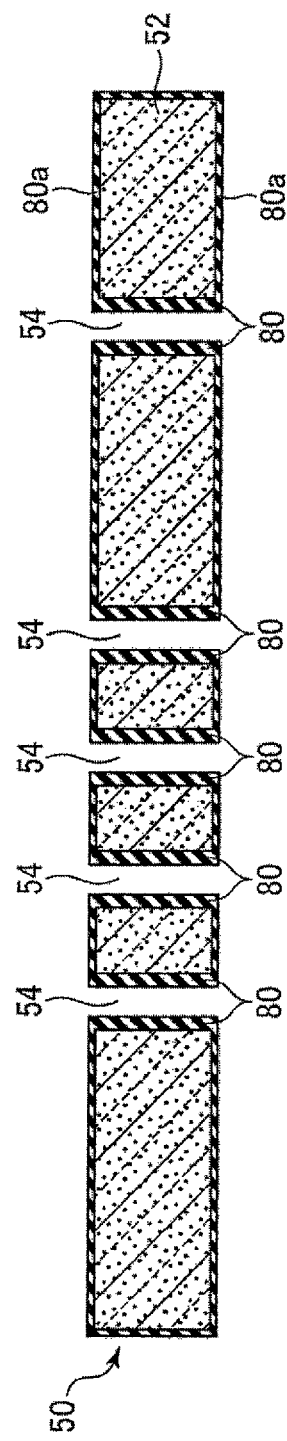

Next, the embedded member 84 embedded in the plurality of through holes 54 on the inner walls of which the silicon oxide film 80 has been formed is removed (FIG. 11B). For example, the embedded member 84 is removed by a solvent or by dry etching.

Second Method for Manufacturing Probe Guide Plate

Figure 12A:
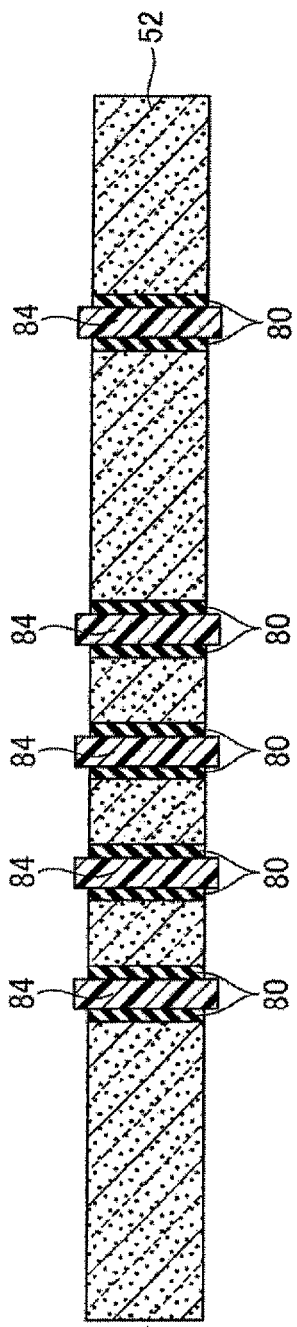
FIGS. 12A to 12C are sectional views of steps showing a second method for manufacturing the probe guide plate according to the second embodiment.
Figure 12B:
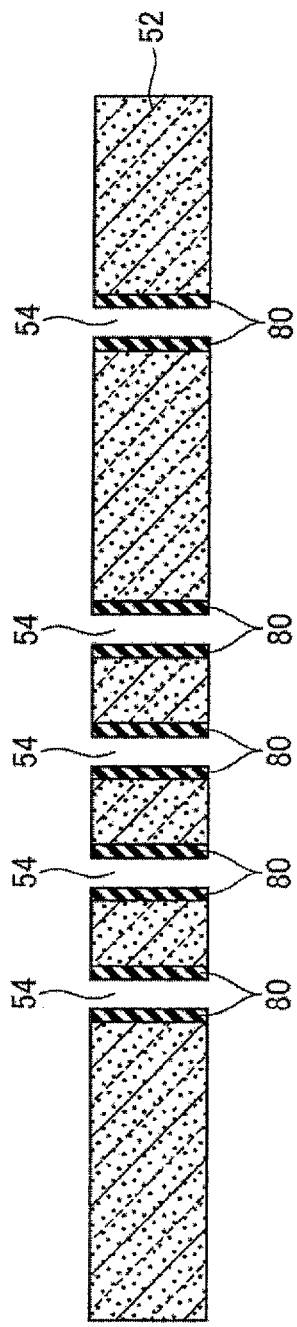
Figure 12C:
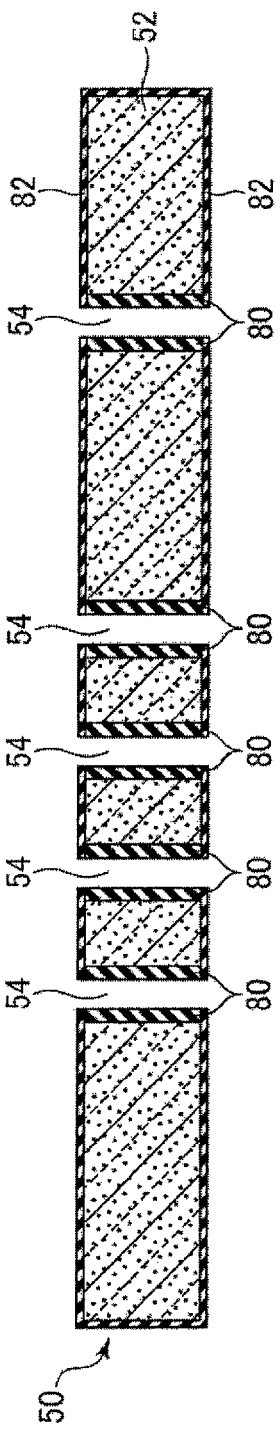

A second method for manufacturing the probe guide plate according to the second embodiment will be described with reference FIGS. 12A to 12C. FIGS. 12A to 12C are sectional views of steps showing the second method for manufacturing the probe guide plate according to the second embodiment. Incidentally, similar constituent members to those in the first embodiment are referred to by the same numerals correspondingly so that description thereof will be omitted or simplified.

Since steps from the step of preparing a silicon substrate 52 to the step of embedding an embedded member 84 in a plurality of through holes 54 are the same as those in the aforementioned first method for manufacturing the probe guide plate according to the second embodiment with reference to FIGS. 10A and 10B, description of the steps will be omitted herein.

Next, the silicon oxide film 80 on the front surface, the back surface and the side surface of the silicon substrate 52 is etched and removed (FIG. 12A). Since the embedded member 84 having a different etching characteristic from that of the silicon oxide film 80 on the inner walls of the through holes 54 has been embedded on the silicon oxide film 80, the silicon oxide film 80 is not etched and removed.

For example, the silicon oxide film 80 is etched in an etching process using a buffered hydrofluoric acid and performed at room temperature.

Alternatively, the silicon oxide film 80 may be etched and removed by dry etching such as RIE. For example, the silicon oxide film 80 may be etched using $O_2$ or $CF_4$ as an etching gas.

Alternatively, the front surface and the back surface of the silicon substrate 52 may be polished to remove the silicon oxide film 80 from the front surface and the back surface of the silicon substrate 52. The embedded member 84 does not have to be embedded in the through holes 54 when the silicon oxide film 80 is removed by polishing.

Next, the embedded member 84 embedded in the plurality of through holes 54 on the inner walls of which the silicon oxide film 80 has been formed is removed (FIG. 12B).

Next, the silicon substrate 52 is thermally oxidized to thereby form a thin silicon oxide film 82 on the front surface, the back surface and the side surface of the silicon substrate 52 (FIG. 12C). For example, the silicon substrate 52 is heated at about 1,000° C. for 15 hours or longer and in an $O_2$ atmosphere. As a result, a silicon oxide film 82 which is, for example, about 1 μm thick is formed on the front surface, the back surface and the side surface of the silicon substrate 52.

Thus, in the second manufacturing method according to the embodiment, the thin silicon oxide film 82 is formed again by thermal oxidation after the silicon oxide film 80 is completely removed from the front surface, the back surface and the side surface of the silicon substrate 52. In this manner, a thin silicon oxide film (insulating film) 82 having a uniform thickness can be formed on the front surface, the back surface and the side surface of the silicon substrate 52.

Third Embodiment

Probe Guide Plate

A probe guide plate according to a third embodiment will be described with reference to FIGS. 13A and 13B. FIG. 13A is a sectional view taken along the line C-C' of the probe guide plate according to the embodiment. FIG. 13B is a plan view of the probe guide plate according to the embodiment. Incidentally, similar constituent members to those in the first embodiment and the second embodiment are referred to by the same numerals correspondingly so that description thereof will be omitted or simplified.

For example, the probe guide plate 50 according to the embodiment can be used in the probe device 20 of the semiconductor testing apparatus 10 shown in FIGS. 1 and 2. For example, the probe guide plate 50 according to the embodiment can be used as each of the probe guide plates 36 and 38 in FIGS. 1 and 2. Incidentally, the probe guide plate 50 is not limited thereto but may be applied to any probe guide plate used in a probe device of any other testing apparatus.

A plurality of through holes 54 for guiding the probes 40 are formed in a substrate 52 of the probe guide plate 50.

For example, the substrate 52 is a silicon substrate with a thickness of about 200 μm. For example, each through hole 54 formed in the substrate 52 has a square shape measuring about 50 μm by about 50 μm. The number and the positions of the plurality of through holes 54 are set in accordance with a plurality of electrodes 15 provided in an DUT 14.

An insulating film 80 with an enough thickness to withstand the probes 40 sliding thereon is selectively formed on inner walls of the plurality of through holes 54. The thick insulating film 80 is not formed on the front surface and the back surface of the substrate 52.

Thus, according to the embodiment, the insulating film 80 which is a silicon oxide film with an enough thickness to withstand the probes 40 sliding thereon is formed on the inner walls of the through holes 54 but the thick insulating film 80 is not formed on the front surface and the back surface of the substrate 52. Therefore, even when there is a difference between the coefficient of thermal expansion of the substrate 52 and the coefficient of thermal expansion of the insulating film 80, stress generated in the substrate 52 can be suppressed satisfactorily so that the misalignment of the plurality of through holes 54 can be satisfactorily suppressed. Accordingly, the probes 40 can be guided to accurate positions.

First Method for Manufacturing Probe Guide Plate

A first method for manufacturing the probe guide plate according to the third embodiment will be described with reference to FIGS. 14A to 14C and FIGS. 15A to 15C. FIGS. 14A to 14C and FIGS. 15A to 15C are sectional views of steps showing the first method for manufacturing the probe guide plate according to the third embodiment. Incidentally, similar constituent members to those in the first embodiment and the second embodiment are referred to by the same numerals correspondingly so that description thereof will be omitted or simplified.

First, a silicon substrate 52 serving for manufacturing the probe guide plate according to the embodiment is prepared. For example, the silicon substrate 52 is about 725 μm thick.

Figure 14A:
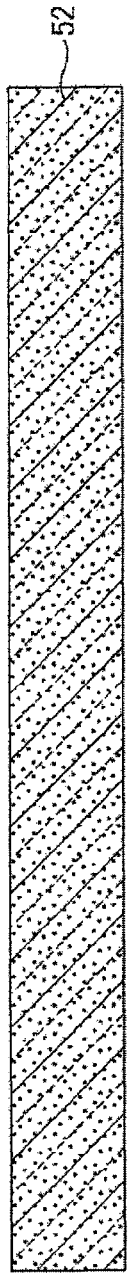
FIGS. 14A to 14C are sectional views of steps showing a first method for manufacturing the probe guide plate according to the third embodiment.

Next, an upper surface (front surface) or a lower surface (back surface) of the silicon substrate 52 is polished so that a silicon substrate 52 with a thickness of about 200 μm is formed (FIG. 14A).

Figure 14B:
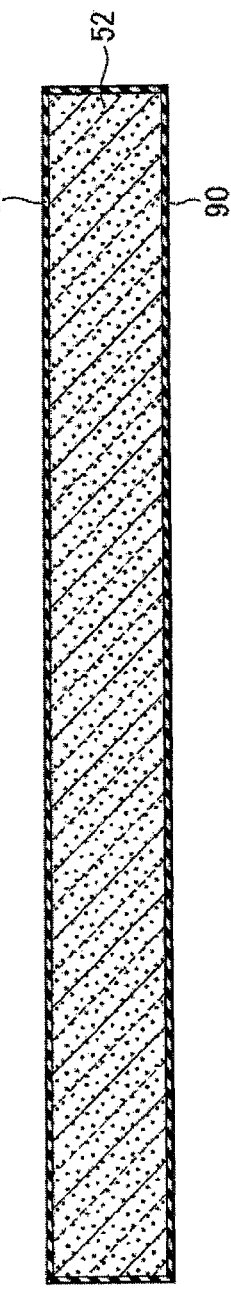

Next, a silicon nitride film 90 which is, for example, about 1 μm thick is formed on the whole surface of the silicon substrate 52, for example, by a CVD method (FIG. 14B). The film thickness of the silicon nitride film 90 may be in a range of about 0.5 μm to 5.0 μm.

To form the silicon nitride film 90 by the CVD method, for example, a raw material gas of $SiH_4$ or $NH_3$ is used and heated, for example, to about 300° C. to thereby chemically vapor-deposit the silicon nitride film 90 on the whole surface of the silicon substrate 52.

Next, resists 92 and 94 are formed on the upper surface (front surface) and the lower surface (back surface) of the silicon substrate 52.

Figure 14C:
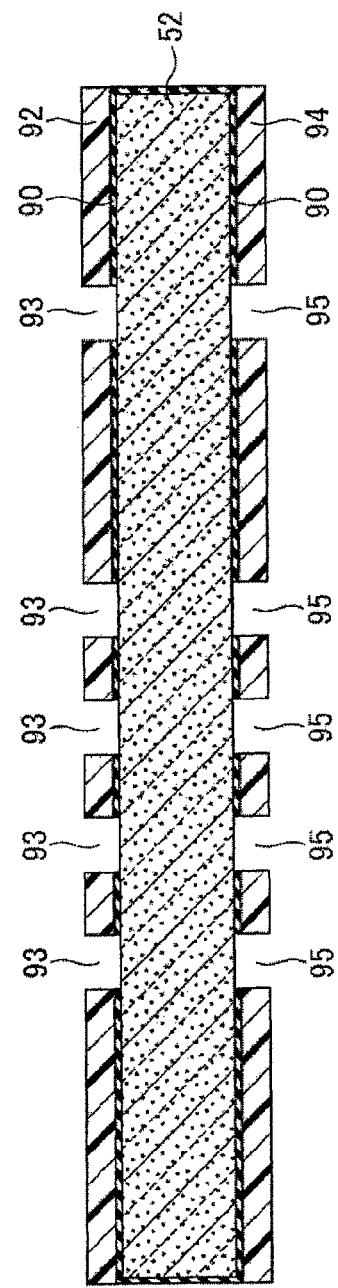

Next, the resists 92 and 94 are patterned so that a plurality of openings 93 and a plurality of openings 95 for forming a plurality of through holes 54 are formed in the resists 92 and 94 respectively (FIG. 14C).

For example, the shape of each opening 93 or 95 formed in the resist 92 or 94 is a square shape measuring about 50 μm by about 50 μm. The number and the positions of the openings 93 or 95 are set in accordance with a plurality of electrodes 15 provided in the DUT 14.

Next, the silicon nitride film 90 in the plurality of openings 93 and 95 is etched and removed, for example, with the resists 92 and 94 as masks (FIG. 14C).

For example, the silicon nitride film 90 is etched in an etching process using a hot phosphoric acid and performed at about 200° C.

Figure 15A:
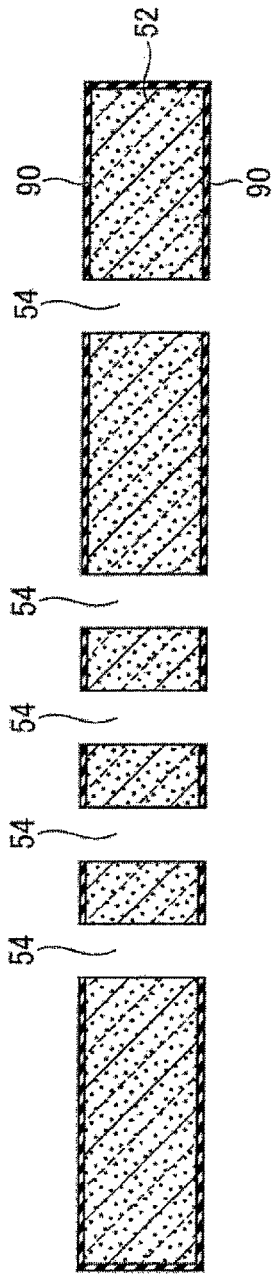
FIGS. 15A to 15C are sectional views of steps showing the first method for manufacturing the probe guide plate according to the third embodiment.

Next, for example, the silicon substrate 52 is perforated from an upper surface (front surface) thereof using the resist 92 as a mask so as to form a plurality of through holes 54 which reach a lower surface (back surface) of the silicon substrate 52 (FIG. 15A). For example, a DEEP-RIE method can be used as the method for forming the through holes 54 in the silicon substrate 52.

Next, the whole of the silicon substrate 52 is thermally oxidized. For example, the silicon substrate 52 is heated at about 1,000° C., for 70 hours or longer and in an $O_2$ atmosphere. As a result, for example, a silicon oxide film (insulating film) 80 with a thickness of about 5 μm is formed on inner walls of the plurality of through holes 54 where the silicon nitride film 90 is not formed (FIG. 15B).

Figure 15B:
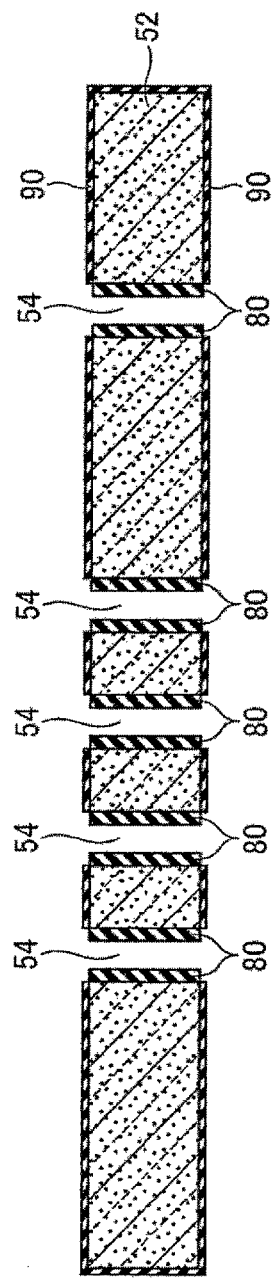

A probe guide plate 50 according to the embodiment may be completed while the silicon nitride film 90 formed on the front surface, the back surface and the side surface of the silicon substrate 52 is still left as it is (FIG. 15B).

Figure 15C:
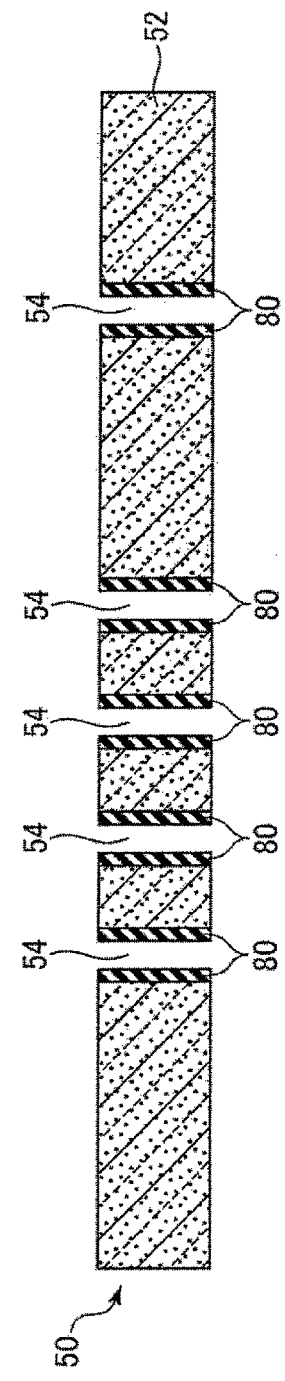

Alternatively, a probe guide plate 50 according to the embodiment may be completed after the silicon nitride film 90 formed on the front surface, the back surface and the side surface of the silicon substrate 52 is etched and removed (FIG. 15C). For example, the silicon nitride film 90 is etched in an etching process using a hot phosphoric acid and performed at about 200° C.

Second Method for Manufacturing Probe Guide Plate

Figure 16A:
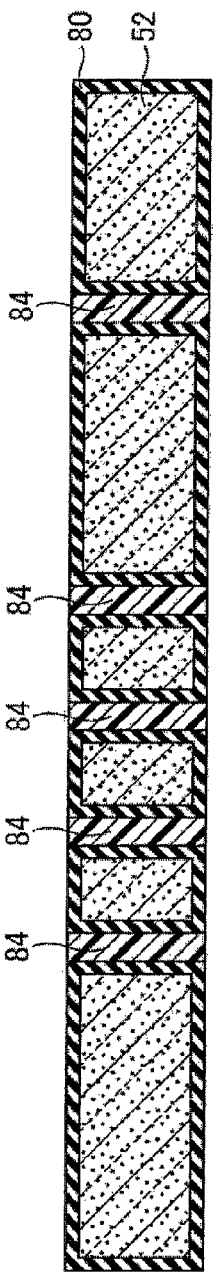
FIGS. 16A to 16C are sectional views of steps showing a second method for manufacturing the probe guide plate according to the third embodiment.
Figure 16B:
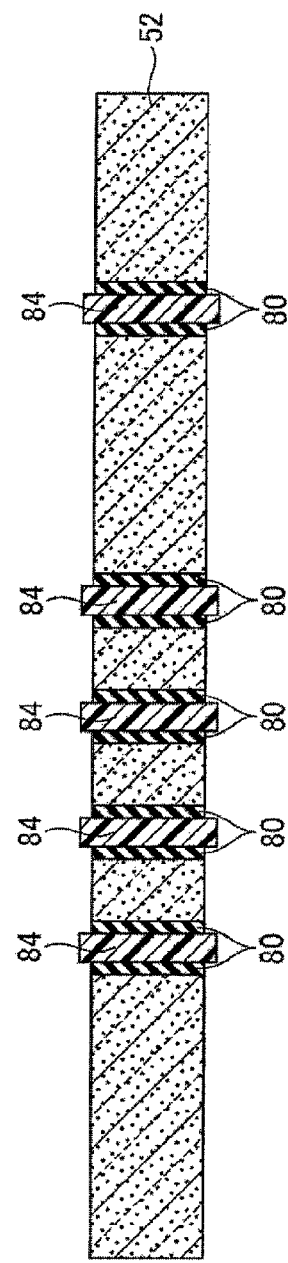
Figure 16C:
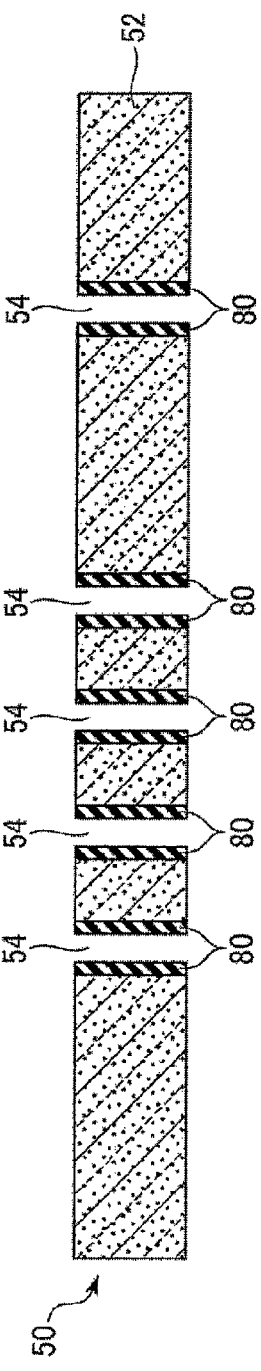

A second method for manufacturing the probe guide plate according to the third embodiment will be described with reference to FIGS. 16A to 16C. FIGS. 16A to 16C are sectional views of steps showing the second method for manufacturing the probe guide plate according to the third embodiment. Incidentally, similar constituent members to those in the first embodiment and the second embodiment are referred to by the same numerals correspondingly so that description thereof will be omitted or simplified.

Since steps from the step of preparing a silicon substrate 52 to the step of embedding an embedded member 84 in a plurality of through holes 54 are the same as those in the aforementioned first method for manufacturing the probe guide plate according to the second embodiment with reference to FIGS. 10A and 10B, description of these steps will be omitted herein (FIG. 16A).

Next, the silicon oxide film (insulating film) 80 on the front surface, the back surface and the side surface of the silicon substrate 52 is etched and removed (FIG. 16B). Since the embedded member 84 having a different etching characteristic from that of the silicon oxide film 80 on the inner walls of the through holes 54 has been embedded on the silicon oxide film 80, the silicon oxide film 80 is not etched and removed.

For example, the silicon oxide film 80 is etched in an etching process using a buffered hydrofluoric acid and performed at room temperature.

Alternatively, the silicon oxide film 80 may be etched and removed by dry etching such as RIE. For example, the silicon oxide film 80 may be etched using $O_2$ or $CF_4$ as an etching gas.

Alternatively, the front surface and the back surface of the silicon substrate 52 may be polished to remove the silicon oxide film 80 from the front surface and the back surface of the silicon substrate 52. The embedded member 84 does not have to be embedded in the through holes 54 when the silicon oxide film 80 is removed by polishing.

Next, the embedded member 84 embedded in the plurality of through holes 54 on the inner walls of which the silicon oxide film 80 has been formed is removed. Thus, a probe guide plate 50 according to the embodiment is completed (FIG. 16C).

Modifications

The aforementioned embodiments are merely exemplary. Various modifications may be made depending on conditions.

For example, according to any one of the embodiments, the probe guide plate 50 according to the embodiment is used as each of the probe guide plates 36 and 38 of the probe device 20 of the semiconductor testing apparatus 10 shown in FIGS. 1 and 2. However, the probe guide plate 50 according to the embodiment is not limited thereto but may be applied to any probe guide plate used in a probe device of any other testing apparatus.

Various aspects of the subject matter described herein are set out non-exhaustively in the following numbered clauses:

1. A method for manufacturing a probe guide plate, comprising:
    (a) forming a through hole for guiding a probe through a substrate;
    (b) forming a first insulating film on an inner wall of the through hole and on first and second main surfaces of the substrate, wherein the second main surface is opposite to the first main surface;
    (c) removing a portion of the first insulating film formed on the first main surface of the substrate; and
    (d) removing a portion of the first insulating film formed on the second main surface of the substrate.

2. A method for manufacturing a probe guide plate, comprising:
    (a) forming a through hole for guiding a probe through a substrate, wherein the substrate comprises a first main surface and a second main surface opposite to the first main surface;
    (b) forming a mask layer on the substrate such that the through hole and portions of the first and second main surfaces of the substrate are exposed; and
    (c) forming a first insulating film on an inner wall of the through hole and on the exposed portions of the first and second main surfaces of the substrate using the mask layer as a mask.

3. A method for manufacturing a probe guide plate, comprising:
    (a) forming a through hole for guiding a probe through a substrate, wherein the substrate comprises a first main surface and a second main surface opposite to the first main surface;
    (b) forming a first insulating film on an inner wall of the through hole and on the first and second main surfaces of the substrate; and
    (c) thinning portions of the first insulating film formed on the first and second main surfaces of the substrate.

4. The method according to clause 3, further comprising:
    (d) embedding a member having a different etching characteristic from that of the first insulating film in the through hole, after step (b), and
    wherein step (c) comprises thinning the portions of the first insulating film by etching.

As described above, the preferred embodiment and the modifications are described in detail. However, the present invention is not limited to the above-described embodiment and the modifications, and various modifications and replacements are applied to the above-described embodiment and the modifications without departing from the scope of claims.

What is claimed is:

1. A probe guide plate comprising:
    a silicon substrate having a through hole for guiding a probe, which is formed through the silicon substrate, wherein the silicon substrate comprises a first main surface and a second main surface opposite to the first main surface; and
    a silicon oxide film formed directly on an inner wall of the through hole and on the first and second main surfaces of the silicon substrate such that portions of the first and second main surfaces of the silicon substrate are exposed.

2. A probe guide plate comprising:
    a silicon substrate having a through hole for guiding a probe, which is formed through the silicon substrate, the silicon substrate comprising a first main surface and a second main surface opposite to the first main surface;
    a silicon oxide film formed on only an inner wall of the through hole; and
    an insulating film formed on the first and second main surfaces of the silicon substrate, wherein a thickness of the insulating film is smaller than that of the silicon oxide film.

3. The probe guide plate according to claim 1, wherein the silicon oxide film is a thermal oxide film which is formed by thermally oxidizing the silicon substrate.

4. The probe guide plate according to claim 2, wherein the silicon oxide film is a thermal oxide film which is formed by thermally oxidizing the silicon substrate.

5. The probe guide plate according to claim 1, wherein a film thickness of the silicon oxide film is in a range of 3 µm to 10 µm.

6. The probe guide plate according to claim 2, wherein a film thickness of the silicon oxide film is in a range of 3 µm to 10 µm.

7. A probe device comprising the probe guide plate according to claim 1.

8. A probe device comprising the probe guide plate according to claim 2.

9. The probe guide plate according to claim 2, wherein the insulating film includes a silicon nitride film.

10. The probe guide plate according to claim 1, wherein the portions of the first and second main surfaces of the silicon substrate that are exposed are only in a neighbor region of the through hole.

11. The probe guide plate according to claim 10, wherein the neighbor region is a region extending in a range of 5 µm to 200 µm around the through hole.

* * * * *